US008569847B2

(12) United States Patent
Endo

(10) Patent No.: US 8,569,847 B2
(45) Date of Patent: Oct. 29, 2013

(54) NONVOLATILE SEMICONDUCTOR MEMORY DEVICE

(75) Inventor: Masato Endo, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/236,690

(22) Filed: Sep. 20, 2011

(65) Prior Publication Data
US 2012/0241872 A1 Sep. 27, 2012

(30) Foreign Application Priority Data
Mar. 24, 2011 (JP) ................................. 2011-065296

(51) Int. Cl.
H01L 29/78 (2006.01)
(52) U.S. Cl.
USPC .................................. 257/408; 257/E29.266
(58) Field of Classification Search
USPC ................. 257/212, 261, 314, 315, 316, 408, 257/21.68, 21.435, 21.662, 296, 336
See application file for complete search history.

(56) References Cited

U.S. PATENT DOCUMENTS

| 5,337,274 | A | 8/1994 | Ohji | |
|---|---|---|---|---|
| 5,514,611 | A * | 5/1996 | Kim et al. | 438/275 |
| 6,323,517 | B1 | 11/2001 | Park et al. | |
| 7,326,607 | B2 * | 2/2008 | Rhodes | 438/200 |
| 7,872,289 | B2 * | 1/2011 | Noguchi et al. | 257/296 |
| 2004/0014285 | A1 | 1/2004 | Lee et al. | |
| 2004/0042317 | A1 * | 3/2004 | Marr et al. | 365/225 |
| 2004/0232476 | A1 * | 11/2004 | Kang et al. | 257/315 |
| 2005/0104138 | A1 * | 5/2005 | Nishibe et al. | 257/408 |
| 2006/0258099 | A1 * | 11/2006 | Lee et al. | 438/258 |
| 2009/0045470 | A1 * | 2/2009 | Kondo et al. | 257/408 |
| 2009/0146701 | A1 * | 6/2009 | Noguchi et al. | 327/144 |
| 2009/0218637 | A1 * | 9/2009 | Gomikawa et al. | 257/402 |
| 2010/0163965 | A1 * | 7/2010 | Kwon | 257/324 |
| 2010/0176435 | A1 * | 7/2010 | Sato et al. | 257/319 |
| 2012/0074482 | A1 * | 3/2012 | Jung et al. | 257/316 |

FOREIGN PATENT DOCUMENTS

| JP | 02-117176 | 5/1990 |
|---|---|---|
| JP | 04-348080 | 12/1992 |
| JP | 2008-192631 | 8/2008 |

OTHER PUBLICATIONS

Singapore Office Action mailed Apr. 19, 2013 in Application No. 201106806-1 filed Sep. 20, 2011.

* cited by examiner

*Primary Examiner* — Kimberly Rizkallah
*Assistant Examiner* — Mounir Amer
(74) *Attorney, Agent, or Firm* — Oblon, Spivak, McClelland, Maier & Neustadt, L.L.P.

(57) ABSTRACT

A nonvolatile semiconductor memory device in one embodiment includes a select gate switch transistor having a gate insulating film formed on a semiconductor substrate, a gate electrode formed on the gate insulating film, and first and second source/drain regions provided in the semiconductor substrate so as to face each other across the gate electrode. The first source/drain region includes a first n-type impurity layer and a second n-type impurity layer which has a higher impurity concentration and has a shallower depth than the first n-type impurity layer. The second source/drain region has a third n-type impurity layer which has a lower impurity concentration and has a shallower depth than the first n-type impurity layer and a fourth n-type impurity layer which has a higher impurity concentration and has a deeper depth than the third n-type impurity layer.

14 Claims, 7 Drawing Sheets

FIG.3

| WIRING \ STATE | READ | WRITE | ERASE |
|---|---|---|---|
| SL | 0V | Vdd | floating |
| SGS | Vdd | 0V | floating |
| WL1(SELECTED) | 0V | Vpgm | 0V |
| WL2~WLn(NON SELECTED) | Vread | Vpass | 0V |
| SGD | Vdd | Vdd | floating |
| BL1(SELECTED) | Vbl | 0V | floating |
| BL2~BLm(NON SELECTED) | Vbl | Vdd | floating |
| Sub | Vbb | Vbb | Vera |

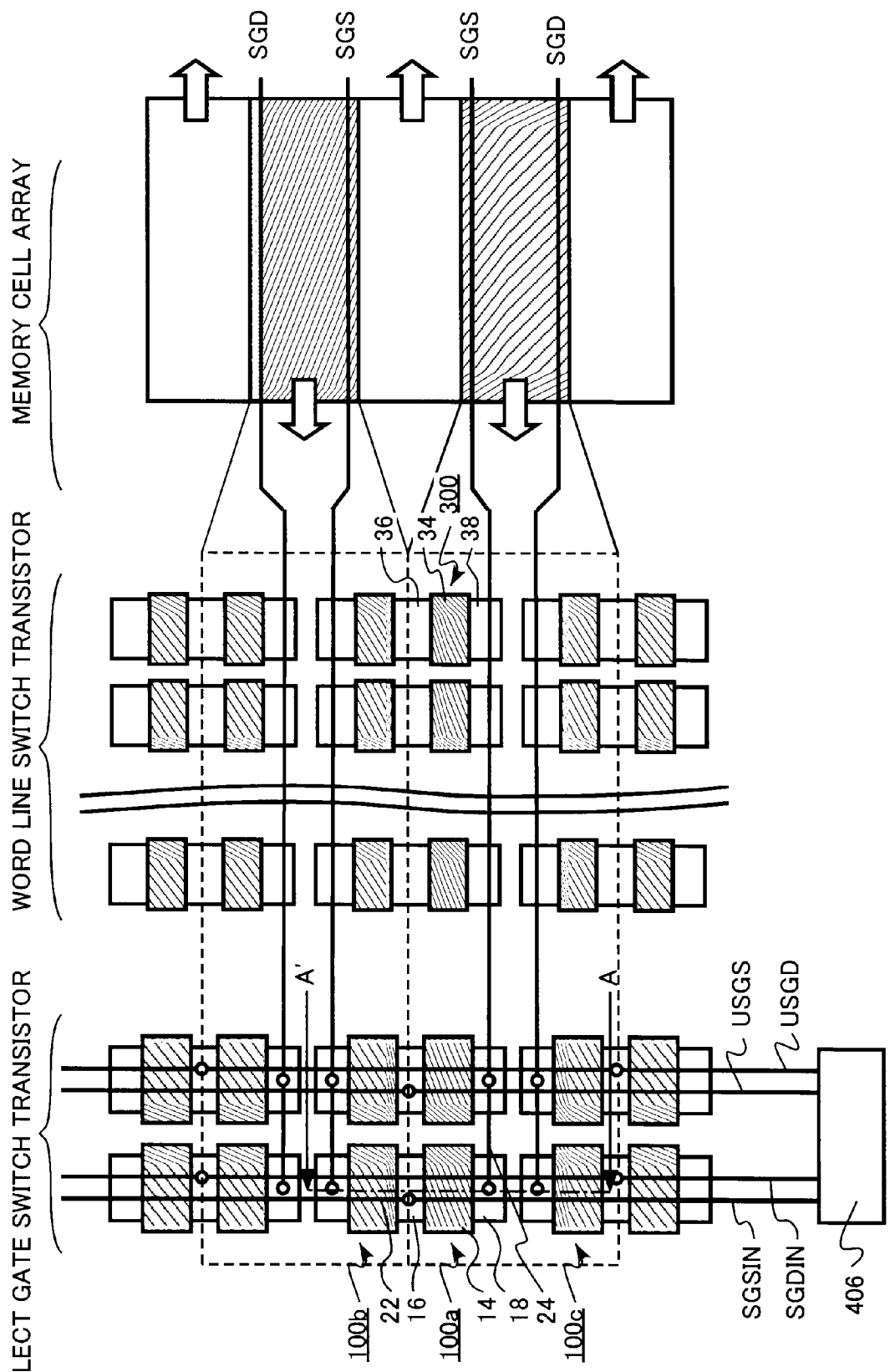

NONVOLATILE SEMICONDUCTOR MEMORY DEVICE

CROSS-REFERENCE TO RELATED APPLICATION

This application is based upon and claims the benefit of priority from Japanese Patent Application No. 2011-065296, filed on Mar. 24, 2011, the entire contents of which are incorporated herein by reference.

FIELD

Embodiments described herein relate generally to a nonvolatile semiconductor memory device.

BACKGROUND

A nonvolatile semiconductor memory device such as an EEPROM, an AND type flash memory, an NOR type flash memory, and a NAND type flash memory is widely known. Among them, the NAND type flash memory is advantageous in increasing a memory density since each memory cell shares a source/drain diffusion layer.

Select gate transistors for selecting respective blocks in the memory cell array are provided in memory cell array end portions of the NAND type flash memory. A select gate switch transistor for controlling the gate voltage of the select gate transistors is provided in a peripheral circuit.

The select gate switch transistor of the NAND type flash memory is required to have high driving power in order to charge and discharge a gate of the select gate transistors. At the same time, a high voltage corresponding to an erase voltage is applied to the source/drain regions of the select gate switch transistor during data erasing operation of a memory cell. Therefore, it is also required to ensure high degree of reliability.

BRIEF DESCRIPTION OF THE DRAWINGS

FIG. 3 is a figure illustrating the operation voltage of the nonvolatile semiconductor device according to the first embodiment;

FIG. 5 is a layout diagram illustrating the nonvolatile semiconductor memory device according to the first embodiment;

DETAILED DESCRIPTION

Figure 1A:
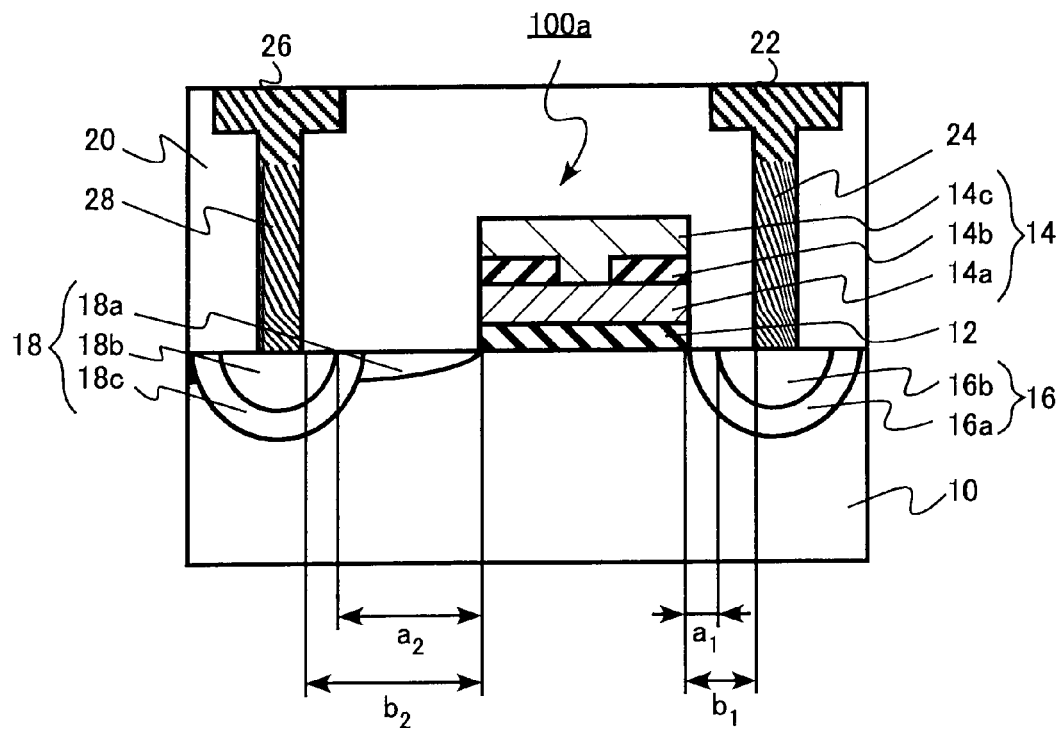
FIGS. 1A and 1B are schematic cross-sectional views of a select gate switch transistor according to a first embodiment.

A nonvolatile semiconductor memory device according to an embodiment is a nonvolatile semiconductor memory device including a select gate switch transistor. The select gate switch transistor includes a gate insulating film formed on a semiconductor substrate, a gate electrode formed on the gate insulating film, and a first source/drain region and a second source/drain region provided in the semiconductor substrate so as to face each other across the gate electrode. The first source/drain region includes a first n-type impurity layer and a second n-type impurity layer which has a higher impurity concentration and has a shallower depth than the first n-type impurity layer. The second source/drain region has a third n-type impurity layer which has a lower impurity concentration and has a shallower depth than the first n-type impurity layer and a fourth n-type impurity layer which has a higher impurity concentration and has a deeper depth than the third n-type impurity layer.

Hereinafter, embodiments will be described with reference to the drawings.

In this specification, a "DDD (Double Diffused Drain) structure" means a kind of a source/drain structure of a MISFET (Metal Insulator Semiconductor Field Effect Transistor), and has a structure having at least two impurity layers, i.e., an $n^+$ impurity layer and an $n^-$ impurity layer enclosing the $n^+$ impurity layer and having a lower impurity concentration than the $n^+$ impurity layer.

In this specification, an "LDD (Lightly Doped Drain) structure" means a kind of a source/drain structure of a MISFET, and has a structure having at least two impurity layers, i.e., an $n^+$ impurity layer and an $n^-$ impurity layer located at the side of the gate electrode with respect to the $n^+$ impurity layer and having a lower impurity concentration and a shallower depth than the $n^-$ impurity layer.

First Embodiment

A nonvolatile semiconductor memory device according to the present embodiment is a nonvolatile semiconductor memory device having a select gate switch transistor. The select gate switch transistor includes a gate insulating film formed on a semiconductor substrate, a gate electrode formed on the gate insulating film, and a first source/drain region and a second source/drain region provided in the semiconductor substrate so as to face each other across the gate electrode. The first source/drain region includes a first n-type impurity layer and a second n-type impurity layer which has a higher impurity concentration and has a shallower depth than the first n-type impurity layer. The second source/drain region has a third n-type impurity layer which has a lower impurity concentration and has a shallower depth than the first n-type impurity layer and a fourth n-type impurity layer which has a higher impurity concentration and has a deeper depth than the third n-type impurity layer. The nonvolatile semiconductor memory device according to the present embodiment is a NAND type flash memory.

In the select gate switch transistor according to the present embodiment, one of the source/drain regions has the DDD structure, and the other thereof has the LDD structure. Since one of them has the DDD structure, the parasitic resistance is reduced. Accordingly, this can ensure high drive power when a select gate line is charged or discharged. Further, since the other of them has the LDD structure, this can ensure surface voltage resistance at the gate edge portion during erasing operation of memory cell data. Therefore, this can also ensure high degree of reliability.

Figure 1B:
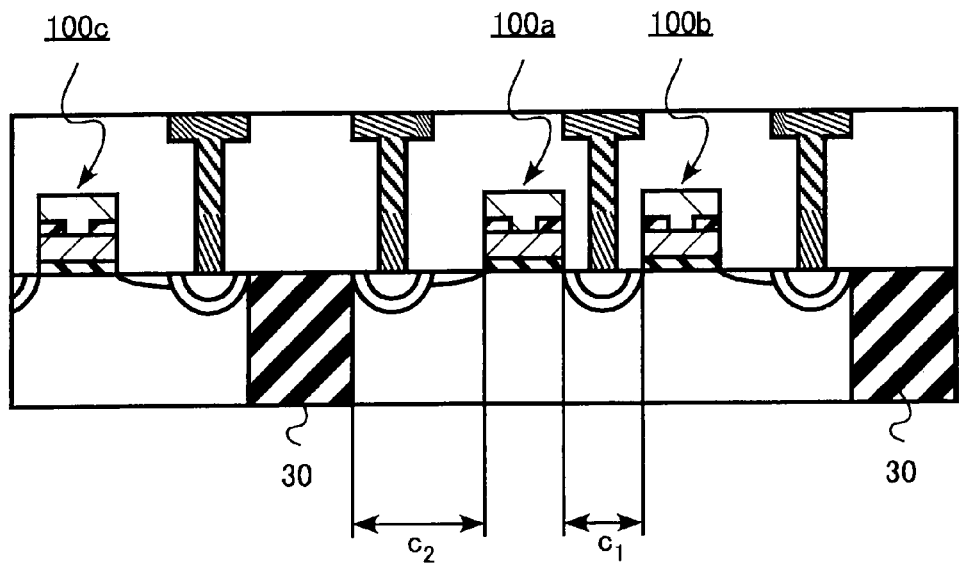

FIG. 1 is a schematic cross-sectional view illustrating the select gate switch transistor according to the present embodiment. FIG. 1A is a schematic cross-sectional view solely illustrating the select gate switch transistor. FIG. 1B is a schematic cross-sectional view including an adjacent select gate switch transistor.

A select gate switch transistor 100a includes a gate insulating film 12 formed on a semiconductor substrate 10, a gate electrode 14 formed on the gate insulating film 12, and a first source/drain region 16 and a second source/drain region 18 provided in the semiconductor substrate to sandwich the gate electrode.

For example, the semiconductor substrate 10 is silicon. For example, the gate insulating film 12 is a silicon oxide film. For example, the gate electrode 14 has the same stacked structure as a word line of a memory cell. For example, it is formed with a charge storage film 14a of polycrystalline silicon, a block insulating film 14b made of a stacked film including a silicon oxide film, a silicon nitride film, and a silicon oxide film, and a control gate electrode film 14c, i.e., a stacked film including, for example, polycrystalline silicon and nickel silicide, which has continuity with the charge storage film 14a via an opening portion provided in the block insulating film 14b.

The materials of the semiconductor substrate 10, the gate insulating film 12, and the gate electrode 14 are not necessarily limited to those materials listed above as examples. For example, the charge storage film 14a may be other materials such as a trap insulating film including SiN, SiON, HfO, HfSiO, HfSiON and so on, and the stack structure of polycrystalline silicon layer and the trap insulating layer. The block insulating film 14b may be HighK materials such as HfO, HfSiON, AlO, LaO, LaAlO, LaAlSiO. The control gate electrode film 14c may be other materials such as a stacked film including polycrystalline silicon and cobalt silicide, a stacked film including polycrystalline silicon and tungsten silicide, a tungsten film, a tungsten nitride film, and the like.

The first source/drain region 16 includes a first n-type impurity layer 16a and a second n-type impurity layer 16b which has a higher impurity concentration and has a shallower depth than the first n-type impurity layer 16a.

For example, the first n-type impurity layer 16a is an n⁻-type diffusion layer using phosphorus (P) as impurity. For example, the impurity concentration of the first n-type impurity layer 16a is about 1E18 atoms/cm³ to 1E20 atoms/cm³.

The second n-type impurity layer 16b is formed at a position farther from the gate electrode 14 than the first n-type impurity layer 16a, and is formed to be enclosed by the first n-type impurity layer 16a. For example, the second n-type impurity layer 16b is an n⁺-type diffusion layer using arsenic (As) as impurity. For example, the impurity concentration of the second n-type impurity layer 16b is about 1E19 atoms/cm³ to 1E21 atoms/cm³.

As described above, the first source/drain region 16 has the so-called DDD structure.

The second source/drain region 18 has a third n-type impurity layer 18a which has a lower impurity concentration and has a shallower depth than the first n-type impurity layer 16a and a fourth n-type impurity layer 18b which has a higher impurity concentration and has a deeper depth than the third n-type impurity layer 18a. In addition, the second source/drain region 18 includes a fifth n-type impurity layer 18c which has a lower impurity concentration and a deeper depth than the fourth n-type impurity layer 18b.

For example, the third n-type impurity layer 18a is an n⁻-type diffusion layer using phosphorus (P) as impurity. For example, the impurity concentration of the third n-type impurity layer 18a is about 1E17 atoms/cm³ to 1E19 atoms/cm³.

The fourth n-type impurity layer 18b is formed at a position farther from the gate electrode 14 than the third n-type impurity layer 18a. For example, the fourth n-type impurity layer 18b is an n⁺-type diffusion layer using arsenic (As) as impurity. For example, the impurity concentration of the fourth n-type impurity layer 18b is about 1E19 atoms/cm³ to 1E21 atoms/cm³.

The fifth n-type impurity layer 18c is formed at a position farther from the gate electrode 14 than the third n-type impurity layer 18a, and is formed to enclose the fourth n-type impurity layer 18b. For example, the fifth n-type impurity layer 18c is an n⁻-type diffusion layer using phosphorus (P) as impurity. For example, the impurity concentration of the fifth n-type impurity layer 18c is about 1E18 atoms/cm³ to 1E20 atoms/cm³.

As described above, the second source/drain region 18 has the so-called LDD structure.

The distance between the gate electrode 14 and the fourth n-type impurity layer 18b ($a_2$ in FIG. 1A) is preferably larger than the distance between the gate electrode 14 and the second n-type impurity layer 16b ($a_1$ in FIG. 1A).

At this occasion, the first n-type impurity layer 16a and the fifth n-type impurity layer 18c preferably have the same impurity concentration and the same depth, and the second n-type impurity layer 16b and the fourth n-type impurity layer 18b preferably have the same impurity concentration and the same depth. This is because the first n-type impurity layer 16a and the fifth n-type impurity layer 18c can be formed by the same manufacturing method, and the second n-type impurity layer 16b and the fourth n-type impurity layer 18b can be formed by the same manufacturing method, so that the manufacturing cost is reduced.

An inter-layer insulating film 20 is formed on the gate electrode 14 and the semiconductor substrate 10. For example, the inter-layer insulating film 20 is a silicon oxide film.

A first contact 24 is formed to penetrate through the inter-layer insulating film 20 so as to connect the first source/drain region 16 and a first wire 22. Further, a second contact 28 is formed to connect the second source/drain electrode 18 and a second wire 26. For example, the first wire 22, the first contact 24, the second wire 26, and the second contact 28 are made of tungsten (W). The bottom of the first contact 24 the second contact 28 may be positioned lower than a surface of the semiconductor substrate.

The first source/drain region 16 is connected via the first contact 24 and the first wire 22 to a gate voltage generation circuit for generating the gate voltage of the select gate transistors. The second source/drain region 18 is connected via the second contact 28 and the second wire 26 to the gate electrode of the select gate transistors.

The distance between the gate electrode 14 and the second contact 28 ($b_2$ in FIG. 1A) is preferably larger than the distance between the gate electrode 14 and the first contact 24 ($b_1$ in FIG. 1A).

As shown in FIG. 1B, two other select gate switch transistors 100b, 100c are provided adjacent to the select gate switch transistor 100a. The first source/drain region 16 is shared as the source/drain region for another select gate switch transistor 100b formed adjacent thereto. On the other hand, the second source/drain region 18 is isolated by a device isolation region 30 from a source/drain region of still another select gate switch transistor 100c adjacent thereto.

For example, the device isolation region 30 is made of a silicon oxide film.

As shown in FIG. 1B, the distance between the gate electrode 14 of the select gate switch transistor 100a and the gate electrode of the another select gate switch transistor 100b at the side of the first source/drain region 16 ($c_1$ in FIG. 1B) is preferably less than the distance between the gate electrode 14 of the select gate switch transistor 100a and the device isolation region 30 at the side of the second source/drain region 18 ($c_2$ in FIG. 1B).

Figure 2:
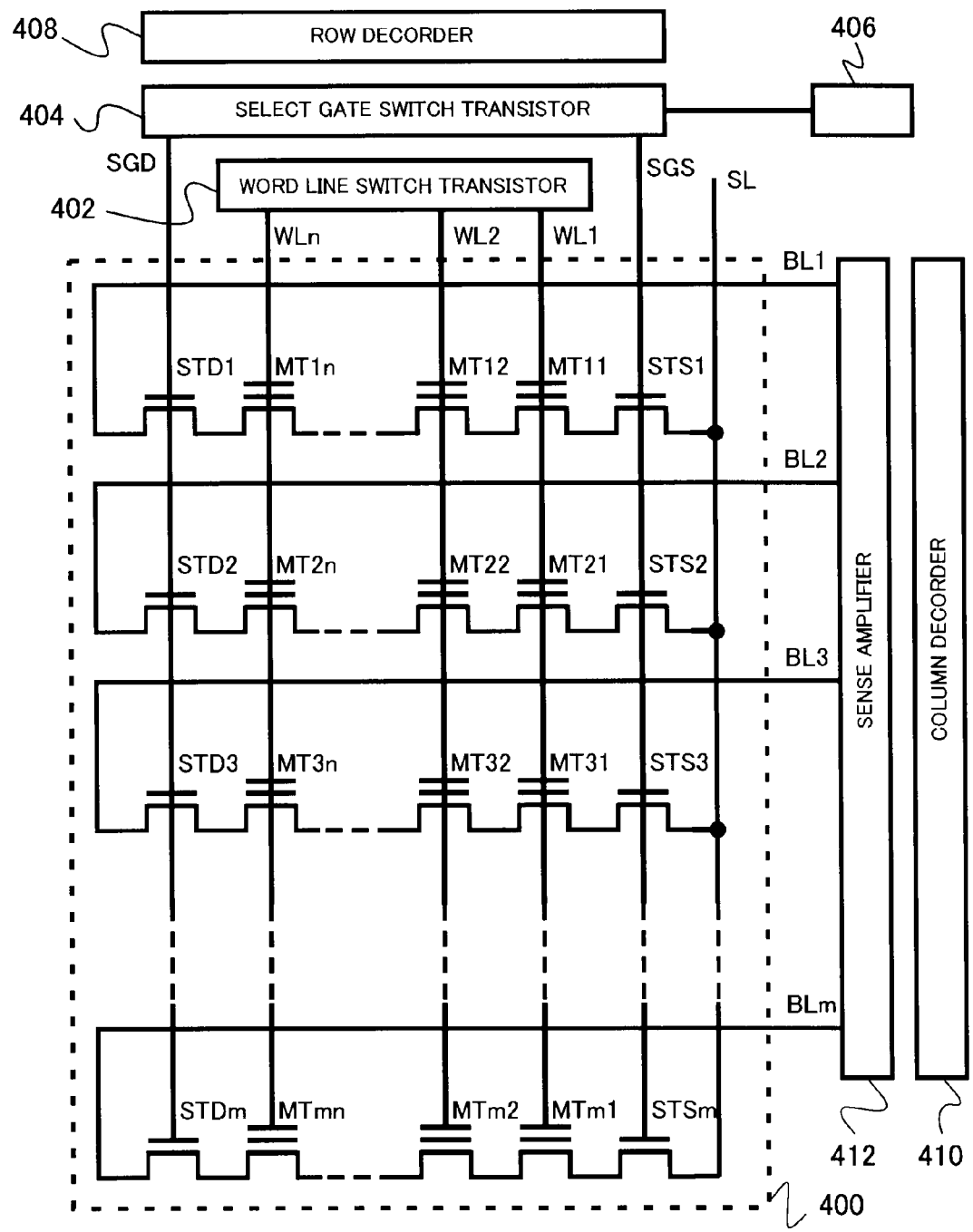
FIG. 2 is a circuit diagram illustrating a nonvolatile semiconductor memory device according to the first embodiment.

FIG. 2 is a circuit diagram illustrating a nonvolatile semiconductor memory device according to the present embodiment. As shown in FIG. 2, for example, a memory cell array 400 is constituted by m×n (m, n are integers) MIS transistors, i.e., memory cell transistors MT11 to MT1n, MT21 to MT2n, . . . , MTm1 to MTmn. In the memory cell array 400, these memory cell transistors are arranged in a column direction and a row direction, so that the plurality of memory cell transistors is arranged in a matrix form.

For example, in the memory cell array 400, the memory cell transistors MT11 to MT1n and the select gate transistors STS1 and STD1 are connected in series to constitute a NAND string, i.e., a cell unit.

A source region of the memory cell transistor MT11 located at an end portion of the array of the group of memory cell transistors MT11 to MT1n connected in series is connected to a drain region of the select gate transistor STS1 for selecting the memory cell transistors MT11 to MT1n. A drain region of the memory cell transistor MT1n located at an end portion of the array of the group of memory cell transistors MT11 to MT1n connected in series is connected to a source region of the select gate transistor STD1 for selecting the memory cell transistors MT11 to MT1n.

Likewise, the select gate transistors STS2 to STSm, the memory cell transistors MT21 to MT2n, . . . , MTm1 to MTmn, and the select gate transistors STD2 to STDm are respectively connected in series to constitute NAND strings.

The sources of the select gate transistors STS1 to STSm are connected to a common source line SL.

The word lines WL1 to WLn of each of the memory cell transistors MT11, MT21, . . . , MTm1, the memory cell transistors MT12, MT22, . . . , MTm2, . . . , and the memory cell transistors MT1n, MT2n, . . . , MTmn are connected to a word line switch transistor 402.

The word lines WL1 to WLn are connected via the word line switch transistor 402 to a boosting circuit and the like. The word line switch transistor 402 controls the operation voltages applied to the gate electrodes of the word lines WL1 to WLn.

The common select gate line SGS of the select gate transistors STS1 to STSm and the common select gate line SGD of the select gate transistors STD1 to STDm are connected to a select gate switch transistor 404.

The select gate line SGS and the select gate line SGD are respectively connected via the select gate switch transistor 404 to a gate voltage generation circuit 406 for generating the gate voltage of the select gate transistors. The select gate switch transistor 404 controls the operation voltages applied to the gate electrodes of the select gate transistors STS1 to STSm.

The word lines WL1 to WLn, the select gate line SGS, and the select gate line SGD are connected via the word line switch transistor 402 and the select gate switch transistor 404 to a row decoder 408. The row decoder 408 decodes a row address signal to obtain a row address decoded signal, and controls the gate voltages of the word line switch transistor 402 and the select gate switch transistor 404.

The drains of the select gate transistors STD1 to STDm are respectively connected to bit lines BL1 to BLm. A column decoder 410 obtains a column address signal, and selects any one of the bit lines BL1 to BLm on the basis of the column address decoded signal.

The sense amplifier 412 amplifies data read from the memory cell transistor selected by the row decoder 408 and the column decoder 410.

Subsequently, applied voltage relationship during erasing operation of memory cell data in the nonvolatile semiconductor memory device of the present embodiment will be explained. FIG. 3 is a figure illustrating the operation voltage of the nonvolatile semiconductor device according to the present embodiment.

In this case, in FIG. 3, Vdd denotes a power supply voltage. For example, it is 1 to 4 V. Vpgm denotes a write voltage. For example, it is 13 to 26 V. Vread denotes a read voltage higher than Vdd. For example, it is 2 to 9 V. Vpass denotes an intermediate voltage. For example, it is 3 to 13 V. Vbl denotes a pre-charge voltage. For example, it is 0.5 to 1 V. Vbb denotes a substrate (well) voltage. For example, it is 0 V. Vera denotes an erase voltage. For example, it is 13 to 26 V.

As shown in FIG. 3, during erasing operation of the memory cell data, a high voltage Vera is applied to the semiconductor substrate (Sub) of the memory cell array. On the other hand, the select gate lines SGS and SGD are in floating state. This is to avoid occurrence of dielectric breakdown of the gate insulating films caused by high electric field applied to the gate insulating films of the select gate transistors STD1 to STDm.

Like the select gate switch transistor 100a as shown in FIG. 1A, the gate electrode of the select gate transistor has such a structure that the charge storage film 14a and the control gate electrode film 14c are conducting via the opening portion provided in the block insulating film 14b. Therefore, if the select gate lines SGS and SGD are maintained at a fixed voltage such as 0 V and Vdd when high voltage Vera is applied to the semiconductor substrate, the difference voltages from Vera are all applied to the gate insulating films.

Figure 4A:
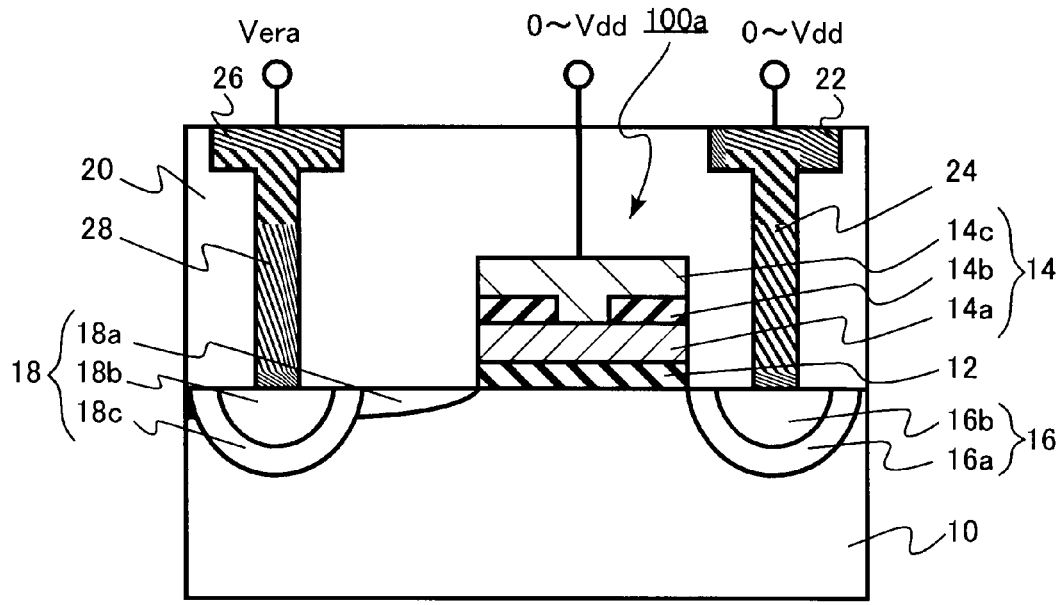
FIGS. 4A and 4B are figures illustrating applied voltage relationship during operation of the select gate switch transistor according to the first embodiment.
Figure 4B:
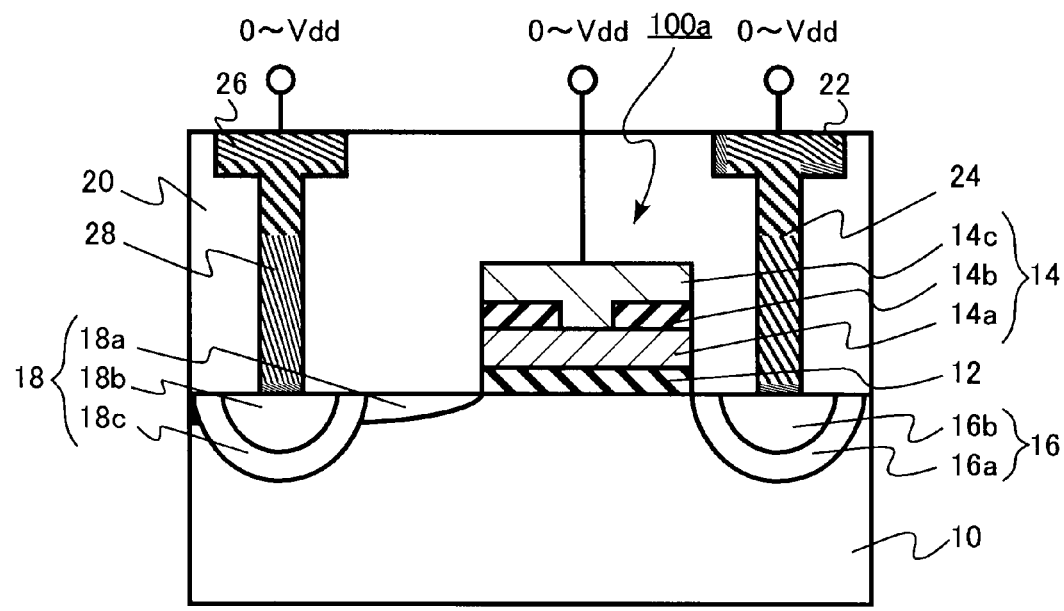

FIG. 4 is a figure illustrating applied voltage relationship during operation of the select gate switch transistor according to the present embodiment. FIG. 4A illustrates applied voltage relationship during erasing operation. FIG. 4B illustrates applied voltage relationship during reading or writing operation.

The applied voltages of the select gate lines SGS and SGD attaining floating state during erasing operation are raised to Vera by coupling with the semiconductor substrate to which Vera is applied. As described above, the second source/drain region 18 of the select gate switch transistor 100a (FIG. 1A) is connected via the second contact 28 and the second wire 26 to the gate electrodes of the select gate transistors, i.e., the select gate line SGS or SGD.

Therefore, as shown in FIG. 4A, Vera is applied to the second source/drain region 18 during erasing operation. The select gate switch transistor 100a applies a voltage such as 0 V or Vdd to the gate electrode 14 to maintain OFF state, so that the select gate lines SGS and SGD are kept in floating state during erasing operation.

Therefore, during erasing operation, high electric field is applied between the second source/drain region 18 and the semiconductor substrate 10, and in particular, high electric field is applied at the edge of the gate electrode. Therefore, this may reduce reliability, e.g., degradation of joint voltage resistance of the second source/drain region 18 and increase of a leak current. For this reason, at the side of the second source/drain region 18, it is required to increase the surface voltage resistance.

On the other hand, the first source/drain region 16 is connected via the first contact 24 and the first wire 22 to the gate voltage generation circuit 406 for generating the gate voltage of the select gate transistors (FIG. 2). The voltage applied from the gate voltage generation circuit 406 is 0 V or Vdd. Therefore, during erasing operation, high voltage such as the voltage applied to the second source/drain region 18 is not applied to the first source/drain region 16.

During reading and writing operations, 0 V or Vdd is applied to the select gate lines SGS and SGD via the select gate switch transistor 100a (FIG. 1A). Therefore, as shown in FIG. 4B, in any state, high voltage such as the voltage applied during erasing operation is not applied to the first source/drain region 16 and the second source/drain region 18.

As described above, in view of the peculiar applied voltage relationship during operation of the select gate switch transistor, the source/drain structure is optimized in the select gate switch transistor according to the present embodiment.

First, the DDD structure is employed as the first source/drain region 16 so that high voltage is not applied thereto in any of the reading, writing, and erasing operations. Therefore, the drive power is increased, the area of the source/drain region 16 is reduced, and the chip size can be easily reduced.

In other words, the impurity concentration of the first n-type impurity layer 16a serving as the n⁻-type diffusion layer is set higher than the impurity concentration of the third n-type impurity layer 18a, and the first n-type impurity layer 16a is made to be deeper than the third n-type impurity layer 18a. This reduces the parasitic resistance of the n⁻-type diffusion layer, and improves the drive power of the select gate switch transistor 100a. The parasitic resistance of the n⁻-type diffusion layer decreases as the distance between the gate electrode 14 and the second n-type impurity layer 16b ($a_1$ in FIG. 1A) decreases.

On the other hand, the LDD structure is employed as the second source/drain region 18 so that high voltage is applied thereto during erasing operation, whereby this improves the surface voltage resistance at the side of the second source/drain region 18.

In other words, the third n-type impurity layer 18a is made into the shallow n⁻-type diffusion layer with low concentration, which enhances depletion in OFF state and increases voltage drop in the n⁻-type diffusion layer, thus improving the surface voltage resistance. In other words, the voltage drop in the n⁻-type diffusion layer increases as the distance between the gate electrode 14 and the fourth n-type impurity layer 18b ($a_2$ in the figure), i.e., the third n-type impurity layer 18a, becomes longer.

In order to increase the voltage drop during erasing operation at the side of the second source/drain region 18 and improve drive power during the reading and writing operations at the side of the first source/drain region 16, the distance between the gate electrode 14 and the fourth n-type impurity layer 18b ($a_2$ in FIG. 1A) is preferably larger than the distance between the gate electrode 14 and the second n-type impurity layer 16b ($a_1$ in FIG. 1A).

The parasitic resistance is also reduced by reducing the distance between the gate electrode 14 and the first contact 24 ($b_1$ in FIG. 1A). The voltage drop is also increased by increasing the distance between the gate electrode 14 and the second contact 28 ($b_2$ in FIG. 1A). In this respect, the distance between the gate electrode 14 and the second contact 28 ($b_2$ in FIG. 1A) is preferably larger than the distance between the gate electrode 14 and the first contact 24 ($b_1$ in FIG. 1A).

Further, since the DDD structure is employed as the first source/drain region 16, as shown in FIG. 1B, the distance between the gate electrode 14 of the select gate switch transistor 100a and the gate electrode of the another select gate switch transistor 100b at the side of the first source/drain region 16 ($c_1$ in FIG. 1B) can be less than the distance between the gate electrode 14 of the select gate switch transistor 100a and the device isolation region 30 at the side of the second source/drain region 18 ($c_2$ in FIG. 1B). In other words, as compared with the case where the DDD structure is employed, the area required in the first source/drain region 16 can be reduced. Therefore, the chip size can be reduced easily.

FIG. 5 is a layout diagram illustrating a nonvolatile semiconductor memory device according to the present embodiment. FIG. 5 shows a layout of a memory cell array, a word line switch transistor, and a select gate switch transistor. In FIG. 5, a cross section of a select gate switch transistor taken along A-A' corresponds to a cross section of FIG. 1B.

The word line switch transistor and the select gate switch transistor corresponding to each block of the memory cell array are alternately arranged as shown by outline arrows with a memory cell array interposed therebetween. The word line switch transistor and the select gate switch transistor of each block other than shaded blocks are omitted from the figure.

In the figure, SGSIN and USGS denote voltages applied to the select gate line SGS for selection and unselection, respectively, of a memory cell. On the other hand, SGDIN and USGD denote voltages applied to the select gate line SGD for selection and unselection, respectively, of a memory cell. SGSIN, USGS, SGDIN, and USGD are generated by the gate voltage generation circuit 406.

In general, the gate length and the gate width of the selection transistor is longer than the gate length and the gate width of the memory cell transistor. Therefore, the capacity of each one select gate lines SGS and SGD is larger than the capacity of one word line. Accordingly, in order to charge and discharge the select gate lines SGS and SGD having large capacities, the gate width of the gate electrode 14 of the select gate switch transistor 100a is larger than the gate width of a gate electrode 34 of a word line switch transistor 300. In order to reduce the off current to a certain level while the gate width is enlarged, the gate length of the gate electrode 14 of the select gate switch transistor 100a is larger than the gate length of the gate electrode 34 of the word line switch transistor 300.

Accordingly, when the word line switch transistor and the select gate switch transistor corresponding to one block of memory cell array are arranged within the same pitch with the distribution as shown in FIG. 5, the margin in the bit line direction of the select gate switch transistor (the gate length direction of the select gate switch transistor) is insufficient due to the large gate length, and in this case, the arrangement in the bit line direction is more difficult than the word line switch transistor.

In the present embodiment, since the high voltage is not applied to the select gate switch transistor 100a at the side of the first source/drain electrode 16 as described above, the DDD structure is employed as the first source/drain region 16. Therefore, the length in the bit line direction of the source/drain electrode 16 can be reduced to a length less than the LDD structure, and the select gate switch transistor can be easily arranged in the bit line direction.

It should be noted that the high voltage Vpgm may be applied to the word lines WL1 to WLn during the writing operation as shown in the applied voltage relationship of FIG. 3. Therefore, the high voltage is applied to both of the first source/drain electrode 36 and the second source/drain electrode 38 of the word line switch transistor 300. Therefore, in the word line switch transistor 300, the LDD structure is preferably employed as both of the first source/drain electrode 36 and the second source/drain electrode 38.

In the present embodiment, as described above, the first source/drain region 16 is shared as the source/drain region for another select gate switch transistor 100b arranged adjacent thereto. Therefore, in this respect, the pitch of the select gate switch transistor is reduced in the bit line direction. Accordingly, it easy to arrange the select gate switch transistor.

Alternatively, the following arrangement may also be employed. The first source/drain region 16 and the source/drain region of the another select gate switch transistor 100*b* arranged adjacent thereto may be independently arranged. In this case, the first source/drain region 16 is also terminated with a device isolation region.

In this case, the distance between the gate electrode 14 of the select gate switch transistor and the device isolation region at the side of the first source/drain region 16 is preferably less than the distance between the gate electrode 14 and the device isolation region at the side of the second source/drain region 18. This is because the pitch of the select gate switch transistor is reduced in the bit line direction.

As described above, according to the nonvolatile semiconductor memory device of the present embodiment, the structure of the source/drain electrode is optimized, and the nonvolatile semiconductor memory device having the select gate switch transistor achieving high drive power and high degree of reliability can be achieved. Further, the pitch of the select gate switch transistor is reduced in the bit line direction, and the chip size can be easily reduced.

Second Embodiment

The nonvolatile semiconductor memory device of the present embodiment is basically the same as the first embodiment except that the impurity of the second n-type impurity layer is arsenic (As), the impurity of the fourth n-type impurity layer is phosphorus (P), and there is no fifth n-type impurity layer. Therefore, description about the same contents as those of the first embodiment will be omitted.

Figure 6:
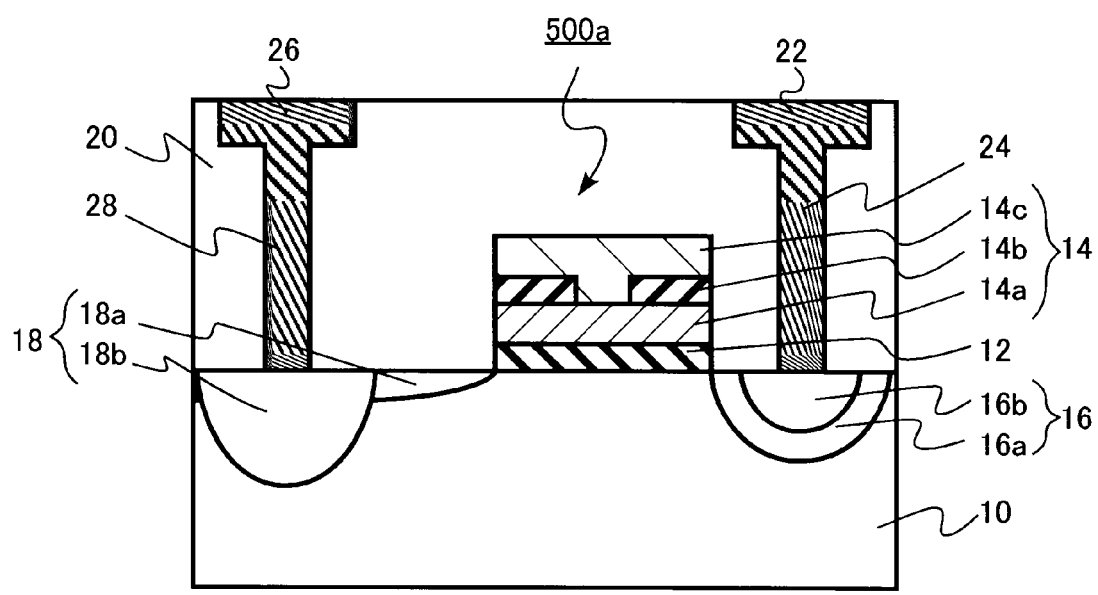
FIG. 6 is a schematic cross-sectional view illustrating a select gate switch transistor according to a second embodiment.

FIG. 6 is a schematic cross-sectional view illustrating a select gate switch transistor according to the present embodiment. The impurity of a second n-type impurity layer 16*b* of a select gate switch transistor 500*a* is arsenic (As), and the impurity of a fourth n-type impurity layer 18*b* is phosphorus (P).

In the first embodiment, both of the second n-type impurity layer 16*b* and the fourth n-type impurity layer 18*b* are made of arsenic, and are formed to have the same impurity concentration and the same depth, in order to facilitate manufacturing process. In contrast, in the present embodiment, the second n-type impurity layer 16*b* and the fourth n-type impurity layer 18*b* can be formed separately, and further, the fourth n-type impurity layer 18*b* is made of phosphorus.

Therefore, the degree of freedom in design is enhanced when the DDD structure of the first source/drain region 16 is optimized to obtain drive power and the LDD structure of the second source/drain region 18 is optimized to achieve high degree of reliability.

In the present embodiment, the fourth n-type impurity layer 18*b* uses phosphorus and made into a diffusion layer deeper than the first n-type impurity layer 16*a*, so that smooth joint profile is formed, whereby the joint voltage resistance is improved.

Third Embodiment

The nonvolatile semiconductor memory device of the present embodiment is the same as the first embodiment except that the first source/drain region of the select gate switch transistor is shared as a source/drain region for another select gate switch transistor arranged adjacent thereto, and the second source/drain region of the select gate switch transistor is shared as a source/drain region for still another select gate switch transistor arranged adjacent thereto. Therefore, description about the same contents as those of the first embodiment will be omitted.

Figure 7:
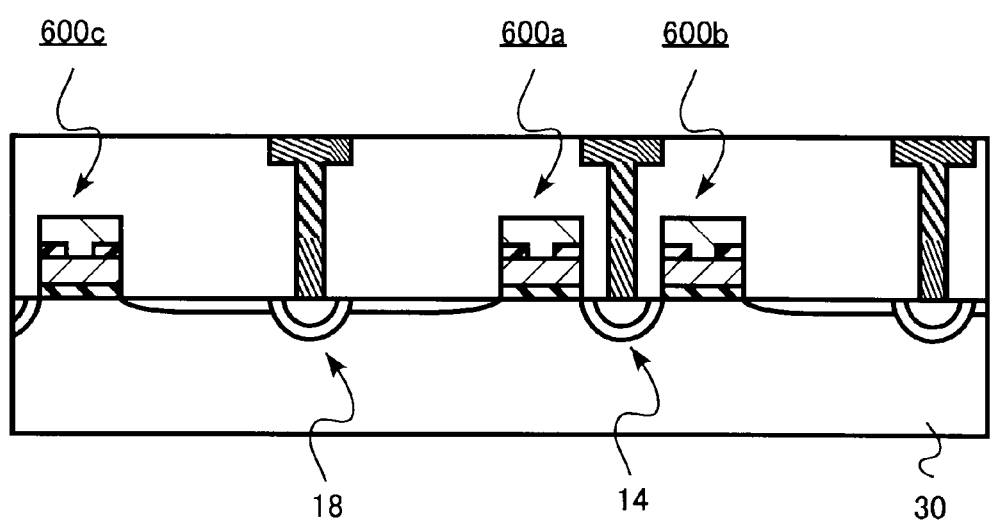
FIG. 7 is a schematic cross-sectional view illustrating a select gate switch transistor according to a third embodiment.
Figure 8:
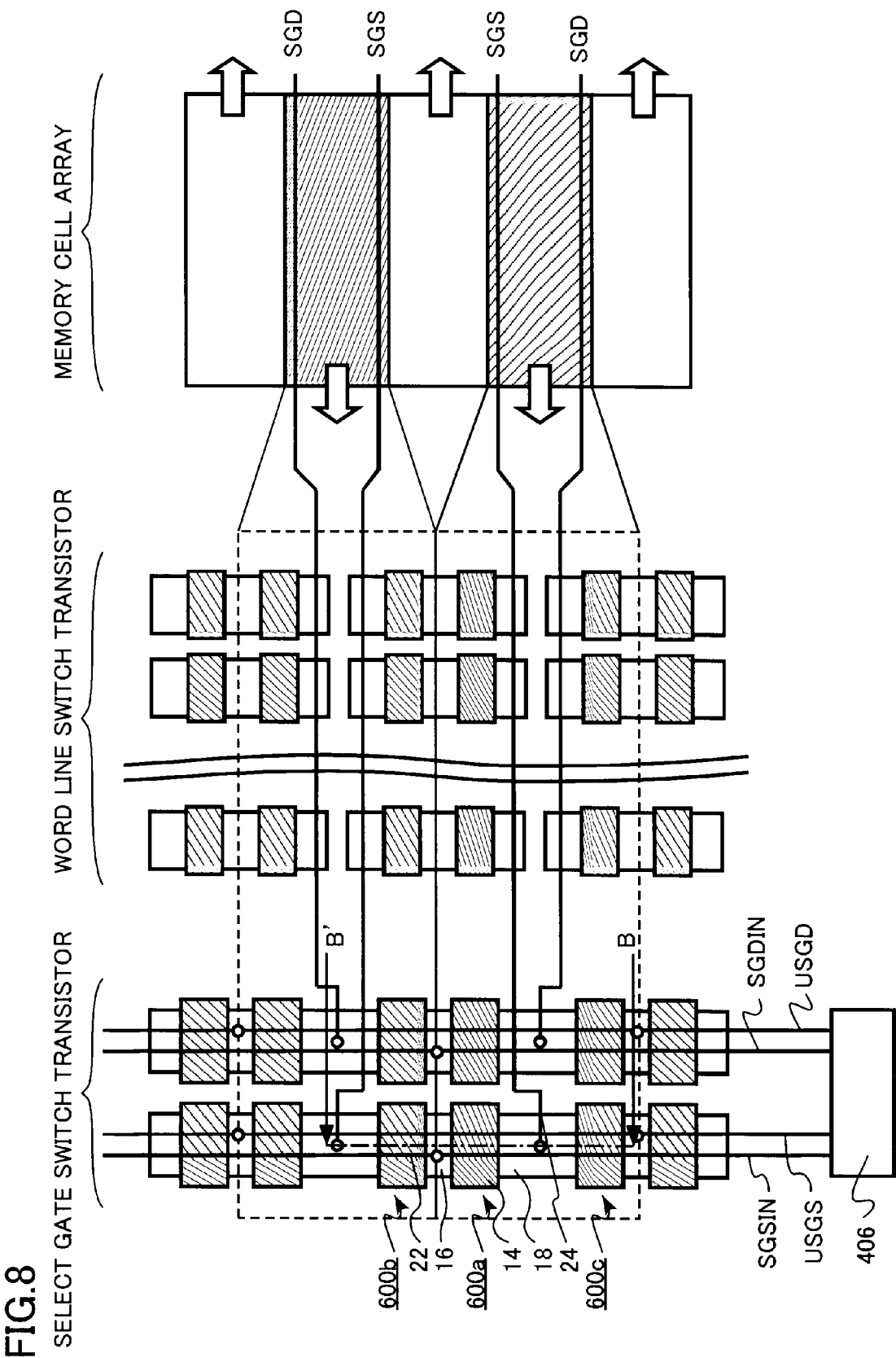
FIG. 8 is a layout diagram illustrating a nonvolatile semiconductor memory device according to the third embodiment.

FIG. 7 is a schematic cross-sectional view illustrating a select gate switch transistor according to the present embodiment. FIG. 8 is a layout diagram illustrating a nonvolatile semiconductor memory device according to the present embodiment. FIG. 8 shows a layout of a memory cell array, a word line switch transistor, and a select gate switch transistor. In FIG. 8, a cross section of a select gate switch transistor taken along B-B' corresponds to a cross section of FIG. 7.

As shown in FIGS. 7 and 8, a first source/drain region 16 of a select gate switch transistor 600*a* is shared as a source/drain region for another select gate switch transistor 600*b* arranged adjacent thereto, and a second source/drain region 18 of a select gate switch transistor 600*a* is shared as a source/drain region for still another select gate switch transistor 600*c* arranged adjacent thereto.

As compared with the first embodiment, the second source/drain region 18 is shared, and accordingly, the pitch in the select gate switch transistor can be further reduced in the bit line direction. Therefore, it is easy to further reduce the chip size.

In this case, the distance between the gate electrode 14 of the select gate switch transistor 600*a* and the gate electrode of the another adjacent select gate switch transistor 600*b* at the side of the first source/drain region 16 is preferably less than the distance between the gate electrode 14 and the gate electrode of the still another adjacent select gate switch transistor 600*c* at the side of the second source/drain region 18. This is because the pitch of the select gate switch transistor is reduced in the bit line direction.

While certain embodiments have been described, these embodiments have been presented by way of example only, and are not intended to limit the scope of the inventions. Indeed, the nonvolatile semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device having a select gate switch transistor, a memory cell, and a select gate transistor provided next to the memory cell, the select gate switch transistor comprising:

a gate insulating film formed on a semiconductor substrate;

a gate electrode formed on the gate insulating film; and a first source/drain region and a second source/drain region formed in the semiconductor substrate so as to face each other, wherein the first source/drain region includes a first n-type impurity layer and a second n-type impurity layer having a higher impurity concentration and a shallower depth than the first n-type impurity layer, the second source/drain region includes a third n-type impurity layer having a lower impurity concentration and a shallower depth than the first n-type impurity layer and a fourth n-type impurity layer having a higher impurity concentration and a deeper depth than the third n-type impurity layer, the second source/drain region is connected to a gate electrode of the select gate transistor via a wiring, and a closest distance between the gate electrode of the select gate switch transistor and the fourth n-type impurity layer is more than a closest distance between the gate electrode of the select gate switch transistor and the second n-type impurity layer.

2. The device according to claim 1, wherein the first source/drain region is connected to a gate voltage generation circuit for generating a gate voltage of the select gate transistor.

3. The device according to claim 1, wherein a distance between the gate electrode of the select gate switch transistor and a device isolation region or a gate electrode of another adjacent select gate switch transistor at a side of the first source/drain region is less than a distance between the gate electrode of the select gate switch transistor and a device isolation region or a gate electrode of still another adjacent select gate switch transistor at a side of the second source/drain region.

4. The device according to claim 1, wherein an impurity of the second n-type impurity layer is arsenic (As), and an impurity of the fourth n-type impurity layer is phosphorus (P).

5. The device according to claim 1, wherein impurities of the second n-type impurity layer and the fourth n-type impurity layer are arsenic (As).

6. The device according to claim 5, wherein the second source/drain region further includes a fifth n-type impurity layer having the same impurity concentration and depth as the first n-type impurity layer, and
the second n-type impurity layer and the fourth n-type impurity layer have the same impurity concentration and depth.

7. The device according to claim 6, wherein the impurity concentration of the fifth n-type impurity layer is 1E18 atoms/$cm^3$ to 1E20 atoms/$cm^3$.

8. The device according to claim 1, wherein the first source/drain region of the select gate switch transistor is shared as a source/drain region for another adjacent select gate switch transistor.

9. The device according to claim 1, wherein the second source/drain region of the select gate switch transistor is shared as a source/drain region for another adjacent select gate switch transistor.

10. The device according to claim 1, wherein the first source/drain region of the select gate switch transistor is shared as a source/drain region for another adjacent select gate switch transistor, and
the second source/drain region of the select gate switch transistor is shared as a source/drain region for still another adjacent select gate switch transistor.

11. The device according to claim 1, wherein the impurity concentration of the first n-type impurity layer is 1E18 atoms/$cm^3$ to 1E20 atoms/$cm^3$.

12. The device according to claim 1, wherein the impurity concentration of the second n-type impurity layer is 1E19 atoms/$cm^3$ to 1E21 atoms/$cm^3$.

13. The device according to claim 1, wherein the impurity concentration of the third n-type impurity layer is 1E17 atoms/$cm^3$ to 1E19 atoms/$cm^3$.

14. The device according to claim 1, wherein the impurity concentration of the fourth n-type impurity layer is 1E19 atoms/$cm^3$ to 1E21 atoms/$cm^3$.

* * * * *